3,843,350
United States Patent Office
3,843,350
Patented Oct. 22, 1974

3,843,350

NOVEL CONDUCTIVE METALLIZATIONS

John Robert Larry, Youngstown, N.Y., assignor to E. I. du Pont de Nemours and Company, Wilmington, Del.

No Drawing. Filed Dec. 27, 1973, Ser. No. 428,718
Int. Cl. H01b *1/02;* B44d *1/18*
U.S. Cl. 75—.5 R 12 Claims

ABSTRACT OF THE DISCLOSURE

Conductor compositions useful for producing conductor patterns on dielectric substrates, the powders comprising silver powder and a coprecipitated Pd/Cu alloy powder. The compositions are less expensive due to the presence of the non-precious metal copper, yet are air-fireable as are noble metal compositions; furthermore, the resultant fired conductors exhibit good adhesion to the substrate and good solder leach resistance.

BACKGROUND OF THE INVENTION

This invention relates to electronic compositions, and more particularly, to metallizations useful in producing high-adhesion conductors on dielectric substrates.

Metallizations which are fired onto ceramic dielectric substrates to produce conductor patterns usually comprise finely divided noble metals and an inorganic binder, and usually are applied to the substrate as a dispersion of the inorganic powders in an inert liquid medium. The metallic component provides the functional (conductive) utility, while the binder (e.g., glass, $Bi_2O_3$, etc.) bonds metal particles to the substrate and to one another. Thick film printing techniques are discussed generally in "Handbook of Materials and Processes for Electronics," C. A. Harper editor, McGraw-Hill, N.Y., 1970, chapter 12.

Mixtures of Pd, Ag and binder are often used to make adherent conductor patterns on dielectric substrates. However, due to the high cost of Pd, there is a distinct need for compositions which are less expensive by virtue of the elimination of at least some Pd, while at the same time retaining the high performance characteristics of fired Pd/Ag patterns, in terms of adhesion and solder leach resistance. Likewise, the composition should be air fireable for practical commercial utilization, even if some base (non-noble) metals are introduced.

SUMMARY OF THE INVENTION

This invention provides powder compositions useful for producing low-cost, air-fireable conductor patterns adherent to dielectric substrates. The compositions comprise finely divided silver particles and finely divided palladium/copper coprecipitated alloy particles; there is at least 35% by weight Pd in the alloy particles, based on total weight of Pd and Cu in the alloy particles. The weight ratio; of palladium/copper alloy to silver in the compositions is in the range of 0.1/1 to 0.5/1, preferably 0.2/1 to 0.4/1. Preferred powder compositions are those wherein said alloy contains 35–75% Pd, based on the total weight of Pd and Cu therein.

Also of this invention are such powder compositions dispersed in an inert vehicle, and a ceramic dielectric substrate having adherent thereto an electrically continuous conductor pattern of the above composition. Such electrically and physically integral conductor patterns are obtained by first printing the above composition on the substrate, and then sintering the same at temperatures below the melting point of the metal powder.

DETAILED DESCRIPTION

The powder compositions of this invention comprise silver powder, Pd/Cu alloy coprecipitate powder, and, usually, inorganic binder powder. The inorganic binder may be any of the conventionally used electronic binder powders, its composition and amount being in accordance with generally known principles and being dependent somewhat on desired fired conductor properties and the dielectric substrate employed. The powders may be dispersed in an inert liquid vehicle, as discussed more fully below.

The use of Pd/Cu coprecipitate to replace Pd powder, of course, leads to economic benefits, but also yields fired (sintered) conductor patterns possessing excellent properties. The Pd/Cu coprecipitate has been found to contain some oxygen, but all proportions are stated in terms of metal content, since oxygen content is dependent upon many variables. When a Pd/Cu coprecipitate or alloy is referred to herein, particles also containing oxygen are comprehended by such terms. Despite the presence of the base metal copper, these powders may be fired in air.

The Pd/Cu coprecipitate may be formed by reductive precipitation from solutions containing salts of Pd and Cu, the proportions of Pd and Cu in the solution being that desired in the coprecipitate powder. Reductants include any of those which are capable of precipitating Pd and Cu simultaneously from solution, including hydrazine sulfate, sodium borohydride, amine boranes, etc. Conditions will vary with the reductant used, but the preferred range of Pd/Cu precipitation conditions using dihydrazine sulfate as the reductant are (1) temperature, 55–80° C., (2) initial pH, 4.5–8.0, (3) $Pd^{++}$ concentration, 14–35 g./l., and (4) $Cu^{++}$ concentration, 10–28 g./l.

The Pd/Cu coprecipitate normally contains at least 35% by weight Pd, based on total Pd and Cu, for reasons of obtaining the desired electrical performance; usually no more than 75% Pd is present, for reasons of economy only, due to the relative expense of Pd.

The proportions of Pd/Cu particles to silver particles are chosen so as to maximize the balance of cost and performance. Normally, the weight ratio of alloy to silver is in the range 0.1/1 to 0.5/1, preferably 0.2/1 to 0.4/1.

The compositions of the present invention comprise finely divided inorganic powders dispersed in inert vehicles. The powders are sufficiently finely divided to be used in conventional screen or stencil printing operations, and to facilitate sintering. Generally, the metallizations are such that at least 90% of the particles are no greater than 5 microns. In optimum metallizations substantially all the particles are less than 1 micron in size. Stated another way, the optimum surface area of the particles is greater than about 0.5 $m.^2/g.$ Powders having a surface area greater than 45 $m.^2/g.$ are difficult to formulate into a printable composition.

The metallizing compositions are prepared from the solids and vehicles by mechanical mixing. The metallizing compositions of the present invention are printed as a film onto ceramic dielectric substrates in the conventional manner. Generally, screen or stencil printing techniques are preferably employed.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to solids in the metallizing compositions of this invention may vary considerably and depends upon the manner in which the dispersion of metallizing composition in vehicle is to be applied and the kind of vehicle used. Generally, from 0.5 to 20 parts by weight of solids per part by weight of vehicle will be used to produce a dispersion of the desired consistency. Preferred dispersions contain 20–70% vehicle.

As indicated above, the metallizing compositions of the present invention are printed onto ceramic substrates, after which the printed substrate is fired to mature (sinter) the metallizing compositions of the present invention, thereby forming continuous conductors on the dielectrics.

The dielectric substrate used in the present invention to make multilayer capacitors may be any dielectric compatible with the electrode composition and firing temperature selected, according to principles well established in the art. Such dielectrics include alumina, barium titanate, barium zirconate, lead zirconate, strontium titanate, calcium titanate, calcium zirconate, lead zirconate, lead zirconate titanate, etc.

As indicated above, the metallizing compositions of the present invention are printed onto ceramic substrates, after which the printed substrate is fired to mature the metallizing compositions of the present invention, thereby forming continuous conductors. The printed substrate is fired at a temperature below the melting point of the noble metal used (to prevent loss of pattern definition), at a temperature high enough to mature (sinter) the conductor pattern. For example, firing is often at about 850° C. for 5–10 minutes at peak temperature.

EXAMPLES

The following examples and comparative showings are presented to illustrate the advantages of the present invention. In the examples and elsewhere in the specification and claims, all parts, percentages, proportions, etc., are by weight unless otherwise stated.

Example 1

A Pd/Cu alloy coprecipitate powder was formed from an aqueous solution containing palladium and copper ions, as follows.

A Pd/Cu coprecipitate (55 Pd/45 Cu based upon weight of Pd and Cu charged into the reactor) was prepared by charging to a 1 liter beaker 77.5 g. of $PdCl_2$ solution (equal to 14.7 g. Pd), 31.1 g. of $CuCl_2 \cdot 2H_2O$ (equal to 11.6 g. Cu) and 150 ml. $H_2O$. The pH was adjusted to 7.2 with 42 ml. of 50% NaOH solution. The temperature increased to 74° C. A reducing solution of 30 g. dihydrazine sulfate dissolved in 100 ml. water was added over a 6-minute period. The temperature and pH decreased to 70° C. and 2.0, respectively. The reduction was incomplete at this stage; 15 ml. of 50% NaOH was added to completely reduce the remaining $PdCl_2$ and $CuCl_2$. The temperature and pH increased to 77° C. and 6.9, respectively. Analyses of the washed and dried black powder showed 49.63% Pd, 39.04% Cu and 9.89% O. The surface area was 42.8 m.²/g. X-ray diffraction of the powder showed a broad, moderately intense peak at 2 theta equal to 40.5° (attributed to Pd/Cu coprecipitate) and small peaks 2 theta equal to 35.5° and 38.8° (attributed to CuO). Pd normally occurs as a sharp intense peak at 2 theta equal to 40.1°. No peak was present at 2 theta equal to 43.3°, which would appear if free Cu was present.

Examples 2–4

A series of conductor compositions, based on a 55 Pd/45 Cu alloy coprecipitate powder (surface area of 41.3 m.²/g.), Ag powder (1.5 m.²/g.) and glass binder, were formulated with a vehicle of ethyl cellulose dissolved in terpineol. Composition data are set forth in Table I. The alloy was prepared as in Example 1 except that the initial pH was 3.2 and the reaction temperature was 60° C.

The composition was screen printed onto a 96% $Al_2O_3$ ceramic substrate through a patterned 200 mesh screen having 9 openings with dimensions 0.08 inch x 0.08 inch aligned in a 3 x 3 matrix. The prints were dried and fired in a belt furnace in three firing sequences having respective maxima 850/850/500° C., to simulate a conductor, a resistor and an encapsulation fire. The time at peak temperature for the 850° C. fires was 8 minutes; the peak time for the 500° C. fire was 2 minutes.

Wire leads were attached to the conductor pads by laying a 20 gauge pretinned copper wire across three of the pads, fluxing with Dutch Boy 115 rosin flux, and dipping into a solder pot of 62 Sn/36 Pb/2 Ag at 220° C. Bond strengths were determined by pulling the soldered leads with an Instron Tester. At least 9 pads were pulled to obtain representative bond strength. Accelerated aging tests were conducted by storing the soldered chip with lead attached at 150° C. for 48 hours.

Solder leach resistance was assessed by the following test. A fired sample containing a 20-mil wide line was (1) dipped into Dutch Boy 115 rosin flux, (2) dip-soldered in 62 Sn/36 Pb/2 Ag at 230° C. for 10 seconds, (3) allowing 3 seconds leveling time and (4) quenching in trichloroethylene. The cycle was repeated until the line leached through or until the soldered film became discontinuous.

Solderability was rated after a 10 seconds dip in 62 Sn/36 Pb/2 Ag at 220° C. using Dutch Boy 115 rosin flux. As indicated in Table I, the compositions exhibited excellent solderability even after the low temperature (500° C.) encapsulation fire, good solder leach resistance and excellent adhesion properties.

TABLE I

Performance of conductors after an 850/850/500° C. firing sequence

| Example | Alloy comp. Pd/Cu (wt. ratio) | Conductor paste (wt. percent) | | | | Ratio Pd/Cu alloy to Ag | Solderability | Solder leach (cycles) | Adhesion (pounds) | |
|---|---|---|---|---|---|---|---|---|---|---|
| | | Pd/Cu | Ag | Binder [a] | Vehicle | | | | Initial | Aged |
| 2 | 55/45 | 18 | 45 | 16% Glass A | 21 | 0.4 | Excellent | 4 | 6.4 | 6.0 |
| 3 | 55/45 | 18 | 45 | 3.5% Glass B<br>10.5% $Bi_2O_2$ | 23 | 0.4 | do | 4 | 7.0 | 5.5 |
| 4 | 55/45 | 12.5 | 50 | 3.0% Glass A<br>9.0% $Bi_2O_3$ | 25.5 | 0.25 | do | 4 | 6.3 | 4.7 |
| 5 | 39/61 | 18 | 45 | 12 Glass A | 25 | 0.4 | Good [b] | | 5.2 | 4.1 |
| 6 | 39/61 | 12.5 | 50 | do | 25.5 | 0.25 | Poor [c] | | | |

[a] Glass A contained 10.87% PbO, 9.37% $SiO_2$, 2.45% CaO, 1.07% $Al_2O_3$, 1.22% $B_2O_3$, 75% $Bi_2O_3$; Glass B contained 43.5% PbO, 37.5% $SiO_2$, 9.8% CaO, 4.3% $Al_2O_3$, 4.9% $B^2O_3$.

[b] The sample fired at 760° C. had good solderability.

[c] The sample fired at 760° C. had poor solderability.

Examples 5–6

These examples illustrate a practical lower limit of the Pd/Cu ratio. A Pd/Cu coprecipitate was prepared whereby the ratio of Pd/Cu as added to the precipitation vessel was 38.8/61.2. The precipitated material had a surface area of 46.4 m.²/g. and was prepared as in Example 1 except that the initial pH was 4.3 and the reaction temperature was 50° C. Analysis of the precipitate showed 32.64% Pd, 49.95% Cu, 17.03% O. Compositions based on this powder were printed as in Example 2 and fired once at either 850 or 760° C. (8 min. at peak temperature in both cycles). Table I sets forth the composition and evaluation of these compositions. The solderability in Example 6 was poor, and significant solder leaching was evident. This ratio of Pd/Cu would be near the lower limit of Pd.

Examples 7–8

The advantage of using a Pd/Cu alloy coprecipitate versus using mechanical mixtures of Pd and Cu is illustrated by these Examples, wherein Example 7 uses the alloy and Example 8 the mixture. A 55 Pd/45 Cu precipitate was used, having a surface area of about 25 m.$^2$/g. The alloy was prepared similarly to that of Example 1, except that the concentration of $Pd^{++}$ and $Cu^{++}$ were 19 g./l. and 16 g./l., respectively, versus 69 g./l. and 54 g./l. in Example 1.

The compositions of Examples 7 and 8 had equivalent metal contents and are set out in Table II, as are experimental results. Samples were printed as in Example 2, but fired at 850° C. As shown in Table II the sample based on Pd/Cu alloy (Ex. 7) gave better solderability, better aged adhesion and slightly better solder leach resistance. In addition, the surface of the fired conductor incorporating the copper-palladium mixture (Ex. 8) was quite rough, even though the finest copper powder (0.5–5 microns) commercially available was used. Surface smoothness is essential for high yields and good reliability on subsequent wire bonding operations (gold or aluminum wire) in thick film circuit production.

36±3° C. Then reductant of 15 g. dihydrazine sulfate dissolved in 100 ml. water was added over a 10 min. period. The reaction began immediately as reductant was added but gradually slowed as the pH decreased. The pH was 1.6 after all reductant was added. After 15 minutes of stiring, 22 ml. 50% NaOH were gradually added to raise the pH and thus bring the recation to completion. The contents were filtered, washed free of chlorides and dried. Yield, 31.2 g.; surface area, 52.7 m.$^2$/g.

In Example 12, the same charge was used as in Example 11. The pH was increased to 7 with 45 ml. 50% NaOH. The temperature was maintained at 68±3° C. The reductant (15 g. dihydrazine sulfate dissolved in 100 ml. water) was added over a 10 min. period. The pH dropped to 1.9 after 15 min. of stirring 19 ml. 50% NaOH were gradually added to increase the pH and bring the reaction to completion. The precipitate was filtered, washed free of chlorides and dried. Yield, 30.5 g.; surface area, 34.1 m.$^2$/g.

In Example 13, the same charge was used as in Example 11. The pH was increased to 7 with 43 ml. 50% NaOH. The contents were heated and maintained at 90±2° C. The reductant solution consisting of 15 g. dihydrazine sulfate dissolved in 100 ml. water was added over a 10-minute period. The pH dropped to 2.2. After 15 minutes 20 ml. 50% NaOH was added slowly to complete the reaction. The precipitate was filtered, washed free of chlorides and dried. Yield, 29.6 g.; surface area, 19.1 m.$^2$/g.

TABLE II

Performance of Pd/Cu alloy coprecipitate versus mixed Pd and Cu powders

| Example | Composition | Wt. percent | Solderability | Solder leach (cycles) | Adhesion (pounds) Initial | Aged |
|---|---|---|---|---|---|---|
| 7 | Pd/Cu alloy | [a] 13.2 | Good | 5 | 6.5 | 5.2 |
| | Ag | 52.8 | | | | |
| | Glass B | [b] 3.0 | | | | |
| | $Bi^2O^3$ | 8.0 | | | | |
| | Vehicle | 23 | | | | |
| 8 | Pd | 6.55 | Fair | 4 | 6.3 | 4.2 |
| | Cu | 5.15 | | | | |
| | Ag | 52.8 | | | | |
| | Glass B | 3.0 | | | | |
| | $Bi^2O^3$ | 8.0 | | | | |
| | Vehicle | 24.5 | | | | |

[a] Ratio of Pd/Cu alloy to Ag, 0.25.
[b] See Table I for composition of Glass B.

Examples 9 and 10

These examples illustrate the superior performance obtained with the systems of this invention (silver powder plus Pd/Cu alloy powder) over Pd/Ag systems of even similar materials cost. Table III lists compositions and performance data. The Pd/Cu alloy (55% Pd and 45% Cu; surface area 25 m.$^2$/g.) was the same as used in Example 7.

TABLE III

Performance of Ag plus Pd/Cu and Pd plus Ag conductors at equivalent metals cost

| Example | Composition | Wt. percent | Solder leach (cycles) | Adhesion (pounds) Initial | Aged |
|---|---|---|---|---|---|
| 9 | Pd | 6.6 | 2 | 5.8 | 3.4 |
| | Ag | 59.4 | | | |
| | Glass B | 3.0 | | | |
| | $Bi_2O_3$ | 8.0 | | | |
| | Vehicle | 23 | | | |
| 10 | Pd/Cu alloy | 13.2 | 5 | 6.5 | 5.2 |
| | Ag | 52.8 | | | |
| | Glass B | 3.0 | | | |
| | $Bi_2O_3$ | 8.0 | | | |
| | Vehicle | 23 | | | |

Examples 11–13

These examples show that increased reaction temperature often results in reduced surface area of the Pd/Cu coprecipitate used herein. In this connection, see Table IV.

In Example 11, there was charged into a 2-liter vessel equipped with a stirrer 1000 ml. distilled water, 50 g. $PdCl_2$ solution (equal to 14 g. Pd) and 37.5 g.

$$CuCl_2 \cdot 2H_2O$$

(equal to 14 g. Cu). The pH was adjusted to 7 with 40 ml. 50% NaOH. The temperature was maintained at

TABLE IV

Pd/Cu alloy surface area versus precipitation temperature

| Example | Reaction temperature (° C.) | Initial pH | Precipitate surface area (m.$^2$/g.) |
|---|---|---|---|
| 11 | 36±3 | 7 | 52.7 |
| 12 | 68±3 | 7 | 34.1 |
| 13 | 90±2 | 7 | 19.1 |

Examples 14–15

These examples, along with Example 12, provide some indication of the effect of initial solution pH on surface area of the resultant precipitate. Table V sets forth data indicating that very high initial pH may lead to higher surface area.

In Examples 14 and 15, as in Example 12, the same reactor charge as Example 11 was used. In Example 14, the pH was adjusted to 4.5 with 20 ml. 50% NaOH. The temperature was maintained at 70±3° C. The reductant solution (15 g. dihydrazine sulfate dissolved in 100 ml. water) was added over a 10 min. period. The pH dropped to 0.9. After 15 minutes 44 ml. 50% NaOH was added to complete the reaction. The precipitate was filtered, washed free of chlorides and dried. Yield, 30.5 g. surface area, 35.3 m.$^2$/g. In Example 15, pH was adjusted to 10.4 with 70 ml. 50% NaOH. The temperature was maintained at 65±5° C. The reductant (15 g. dihydrazine sulfate in 100 ml. water) was added over a period of 15 minutes. The pH dropped to 9.9. The reaction was complete at this point. The precipitate was filtered, washed free of chlorides and dried. Yield, 31.1 g., surface area 84.9 $m.^2/g.$

TABLE V

Pd/Cu alloy surface area versus initial solution pH

| Example | Initial pH | Reaction temperature (° C.) | Surface area ($m.^2/g.$) |
|---|---|---|---|
| 14 | 4.5 | 70±3 | 35 |
| 12 | 7.0 | 68±3 | 34 |
| 15 | 10.4 | 65±5 | 85 |

Examples 16–20

A series of experiments were conducted in which 31.1 g. $CuCl_2 \cdot 2H_2O$ (equal to 11.6 g. Cu) and 52.5 g. $PdCl_2$ solution (equal to 14.7 g. Pd) were reduced from solutions at various concentrations to examine concentration effects on surface area of the precipitated Pd/Cu alloy. All other precipitation variables were kept essentially constant. Table VI summarizes these data.

TABLE VI

Effect of Metal Concentration on Pd/Cu Alloy Surface Area

| Example | $Pd^{+2}$ (g./l.) | $Cu^{+2}$ (g./l.) | Temp. (° C.) | Initial pH | Surface area ($m.^2/g.$) |
|---|---|---|---|---|---|
| 16 | 98 | 77 | 69±4 | 7.0 | 41.1 |
| 17 | 33 | 26 | 69±5 | 7.0 | 36.0 |
| 18 | 20 | 15.5 | 67±3 | 7.0 | 32.4 |
| 19 | 14.7 | 11.6 | 67±2 | 7.0 | 28.6 |
| 20 | 7.4 | 5.8 | 68±3 | 7.0 | 52.9 |

The Pd/Cu coprecipitated powder produced in Examples 11–20 was evaluated side by side by the printing and firing technique of Example 2. The compositions contained 13.2% Pd/Cu alloy, 52.8% Ag (1.5 $m.^2/g.$), 3% Glass B of Table I, 8% $Bi_2O_3$ and 23% vehicle (ethyl cellulose, terpineol, dibutyl phthalate, and soya lecithin). All samples were fired once at 850° C. (8 minutes at peak). Resultant data are summarized in Table VII.

TABLE VII

| Ex. | Source of Pd/Cu (Example No.) | Solderability | Solder leach (cycles) | Adhesion (pounds) Initial | Adhesion (pounds) Aged |
|---|---|---|---|---|---|
| 21 | 11 | Good | 2 | | |
| 22 | 12 | do | 4 | 6.2 | 5.6 |
| 23 | 13 | Fair | 4 | 6.1 | 4.5 |
| 24 | 14 | Good | 4 | 6.4 | 5.2 |
| 25 | 15 | do | 3 | | |
| 26 | 16 | do | 3 | | |
| 27 | 17 | do | 3 | | |
| 28 | 18 | do | 5 | 5.8 | 5.2 |
| 29 | 19 | do | 4 | 6.4 | 5.5 |
| 30 | 20 | do | 4 | | |

I claim:

1. Powder compositions useful for producing low-cost, air-fireable conductor patterns adherent to dielectric substrates, said compositions consisting essentially of finely divided silver particles and finely divided palladium/copper alloy particles; there being at least 35% by weight Pd in said alloy particles, based on total weight of Pd and Cu therein; and the weight ratio of palladium/copper alloy to silver being in the range of 0.1/1 to 0.5/1.

2. Powder compositions according to claim 1 wherein the weight ratio of said alloy to silver is in the range 0.2/1 to 0.4/1.

3. Powder compositions according to claim 2 wherein said alloy contains 35–75% Pd, based on the total weight of Pd and Cu therein.

4. Powder compositions according to claim 1 wherein said alloy contains 35–75% Pd, based on total weight of Pd and Cu therein.

5. Powder compositions according to claim 1 dispersed in an inert vehicle.

6. Powder compositions according to claim 2 dispersed in an inert vehicle.

7. Powder compositions according to claim 3 dispersed in an inert vehicle.

8. Powder compositions according to claim 4 dispersed in an inert vehicle.

9. A ceramic dielectric substrate having adherent thereto the conductor patterns of the composition of claim 1.

10. A ceramic dielectric substrate having adherent thereto the conductor patterns of the composition of claim 2.

11. A ceramic dielectric substrate having adherent thereto the conductor patterns of the composition of claim 3.

12. A ceramic dielectric substrate having adherent thereto the conductor patterns of the composition of claim 4.

References Cited

UNITED STATES PATENTS

| | | | |
|---|---|---|---|
| 3,374,110 | 3/1968 | Miller | 106—1 X |
| 3,385,799 | 5/1968 | Hoffman | 106—1 X |
| 3,407,081 | 10/1968 | Ballard | 106—1 |
| 3,413,240 | 11/1968 | Short | 106—1 X |
| 3,434,877 | 3/1969 | Degenkolb et al. | 106—1 X |
| 3,516,857 | 6/1970 | Short | 252—514 X |

L. DEWAYNE RUTLEDGE, Primary Examiner

A. J. STEINER, Assistant Examiner

U.S. Cl. X.R.

75—0.5 A, 0.5 B, 0.5 C; 252—514; 117—212; 106—1